US012080627B1

(12) United States Patent
Mohamed et al.

(10) Patent No.: US 12,080,627 B1
(45) Date of Patent: Sep. 3, 2024

(54) THERMAL MANAGEMENT DEVICE FOR HIGH HEAT FLUX APPLICATIONS INCLUDING A MICROCHANNEL HEAT SINK ASSEMBLY AND METHOD FOR MANUFACTURING THE SAME

(71) Applicant: University of Sharjah, Sharjah (AE)

(72) Inventors: Essam Mohamed, Sharjah (AE); Chaouki Ghenai, Sharjah (AE)

(73) Assignee: University of Sharjah, Sharjah (AE)

( * ) Notice: Subject to any disclaimer, the term of this patent is extended or adjusted under 35 U.S.C. 154(b) by 0 days.

(21) Appl. No.: 18/171,020

(22) Filed: Feb. 17, 2023

(51) Int. Cl.
*H01L 23/473* (2006.01)
*H01L 21/48* (2006.01)
*H01L 23/00* (2006.01)

(52) U.S. Cl.
CPC ........ *H01L 23/473* (2013.01); *H01L 21/4882* (2013.01); *H01L 24/29* (2013.01); *H01L 24/32* (2013.01); *H01L 2224/29193* (2013.01); *H01L 2224/32245* (2013.01); *H01L 2924/01006* (2013.01)

(58) Field of Classification Search
CPC ............... H01L 23/473; H01L 21/4882; H01L 2224/32245; H01L 2924/01006; H01L 23/427; H05K 7/20254; H05K 7/20263; H05K 7/20272; H05K 7/20281; H05K 7/2029; H05K 7/20509; H05K 7/20727; H05K 7/20781; H05K 7/20518; H05K 7/20809; H05K 7/20772; H05K 7/20309; H05K 7/20336; G06F 2200/201
USPC ................ 257/712, 713, 714, 715, 716, 722
See application file for complete search history.

(56) References Cited

U.S. PATENT DOCUMENTS

| 5,304,846 | A  | * | 4/1994 | Azar ........................ F28F 3/02 257/E23.113 |
| 8,963,321 | B2 | * | 2/2015 | Lenniger .................. H01L 24/48 257/E23.101 |
| 8,987,891 | B2 | * | 3/2015 | Di Stefano ............. H01L 23/34 257/714 |
| 9,750,159 | B2 | * | 8/2017 | Campbell .......... H05K 7/20809 |
| 9,887,146 | B2 | * | 2/2018 | Flotta ................. H05K 7/20327 |
| 10,770,372 | B2 | * | 9/2020 | Gutala ................ H01L 21/4882 |
| 10,905,028 | B2 | * | 1/2021 | Yu ....................... H05K 7/20263 |

(Continued)

OTHER PUBLICATIONS

Heat sink with microchannels, DE-202022105382-U1, Oct. 5, 2022 (pp. 1-23) (Year: 2022).*

(Continued)

*Primary Examiner* — Khiem D Nguyen
(74) *Attorney, Agent, or Firm* — MH2 TECHNOLOGY LAW GROUP, LLP

(57) ABSTRACT

The invention discloses a thermal management device for high heat flux application in a microelectronic device comprising an integrated board, a microelectronic chip, a thermal interface materials component, a microchannel heat sink assembly operatively connected to the thermal interface materials component, for heat dissipation from the integrated board and the microelectronic chip to the thermal interface materials component, wherein the microchannel heat sink assembly comprises a housing and an adiabatic wall configured to allow heat to pass across the microchannel heat sink assembly. The microchannel heat sink assembly is a four-compartment microchannel heat sink assembly with symmetrical areas.

19 Claims, 14 Drawing Sheets

(56) References Cited

U.S. PATENT DOCUMENTS

| | | | | |
|---|---|---|---|---|
| 11,515,232 | B2* | 11/2022 | Chiu | H01L 24/16 |
| 11,611,192 | B2* | 3/2023 | Amalfi | H01S 5/0243 |
| 2008/0041560 | A1* | 2/2008 | Paradis | H01S 5/02484 |
| | | | | 257/E23.098 |
| 2020/0100396 | A1* | 3/2020 | Iyengar | H05K 7/20254 |
| 2020/0411406 | A1* | 12/2020 | Kawakita | H01L 23/433 |
| 2021/0054253 | A1* | 2/2021 | Dai | C01B 32/194 |
| 2021/0407888 | A1* | 12/2021 | Elsherbini | H01L 23/467 |
| 2021/0410328 | A1* | 12/2021 | Yang | H05K 7/20254 |
| 2022/0338387 | A1* | 10/2022 | Enright | H05K 7/20727 |
| 2022/0412662 | A1* | 12/2022 | Salamon | H01L 23/427 |

OTHER PUBLICATIONS

Blackburn, D.L. Temperature measurements of semiconductor devices-a review. In Twentieth Annual IEEE Semiconductor Thermal Measurement and Management Symposium (IEEE Cat. No. 04CH37545). 2004. IEEE.

Avenas, Y., L. Dupont, and Z. Khatir, Temperature measurement of power semiconductor devices by thermo-sensitive electrical parameters~A review, IEEE transactions on power electronics, 2011. 27(6): p. 3081-3092.

Abo-Zahhad, E.M., et al., Flow boiling in a four-compartment heat sink for high-heat flux cooling: A parametric study, in Energy Conversion and Management. 2021. p. 113778.

He, Z., Y. Yan, and Z. Zhang, Thermal management and temperature uniformity enhancement of electronic devices by micro heat sinks: A review. Energy, 2021. 216: p. 119223.

Moore, G.E., Cramming more components onto integrated circuits. 1965, McGraw-Hill New York.

Karayiannis, T.G. and M.M. Mahmoud, Flow boiling in microchannels: Fundamentals and applications, in Applied Thermal Engineering. 2017. p. 1372-1397.

Chen, Z., et al., Design and Simulation of the Thermal Management System for 5G Mobile Phones, in Advances in Heat Transfer and Thermal Engineering. 2021, Springer. p. 563-567.

Shakouri, A. and Y. Zhang, On-chip solid-state cooling for integrated circuits using thin-film microrefrigerators. IEEE Transactions on Components and Packaging Technologies, 2005. 26(1): p. 65-69.

Xie, G., et al., Computational Study and Optimization of Laminar Heat Transfer and Pressure Loss of Double-Layer Microchannels for Chip Liquid Cooling, in Journal of Thermal Science and Engineering Applications. 2013.

Ling, Z., et al., Review on thermal management systems using phase change materials for electronic components. Li-ion batteries and photovoltaic modules, in Renewable and Sustainable Energy Reviews. 2014.

Hanks, D.F., et al., Nanoporous membrane device for ultra high heat flux thermal management. Microsystems & nanoengineering, 2018. 4(1): p. 1-10.

Kheirabadi, A.C. and D. Groulx, Cooling of server electronics: A design review of existing technology, Applied Thermal Engineering, 2016. 105: p. 622-638.

Kalbasi, R., Introducing a novel heat sink comprising PCM and air-Adapted to electronic device thermal management. International Journal of Heat and Mass Transfer, 2021. 169: p. 120914.

Malik, M., I. Dincer, and M.A. Rosen, Review on use of phase change materials in battery thermal management for electric and hybrid electric vehicles. International Journal of Energy Research, 2016. 40(8): p. 1011-1031.

Xiao, C., et al., Custom design of solid—solid phase change material with ultra-high thermal stability for battery thermal management. Journal of Materials Chemistry A, 2020. 8(29): p. 14624-14633.

Tuckerman, D.B. and R.F.W. Pease, High-Performance Heat Sinking for VLSI, in IEEE Electron Device Letters. 1981.

Ramesh, K.N., T.K. Sharma, and G. Rao, Latest advancements in heat transfer enhancement in the micro-channel heat sinks: a review. Archives of Computational Methods in Engineering, 2021. 28(4): p. 3135-3165.

Zhou, J., et al., Micro-channel heat sink: a review. Journal of Thermal Science, 2020. 29(6): p. 1431-1462.

Alihosseini, Y., et al., Effect of a micro heat sink geometric design on thermo-hydraulic performance: A review, Applied Thermal Engineering, 2020. 170: p. 114974.

Gong, L., et al., Parametric numerical study of flow and heat transfer in microchannels with wavy walls, in Journal of Heat Transfer. 2011.

Khoshvaght-Aliabadi, M., et al., Effects of nooks configuration on hydrothermal performance of zigzag channels for nanofluid-cooled microelectronic heat sink. Microelectronics Reliability, 2017, 79: p. 153-165.

Al-Neama, A.F., et al., An experimental and numerical investigation of the use of liquid flow in serpentine microchannels for microelectronics cooling. Applied Thermal Engineering. 2017. 116: p. 709-723.

Lee, Y.-J., P.-S. Lee, and S.-K. Chou. Enhanced microchannel heat sinks using oblique fins. in International Electronic Packaging Technical Conference and Exhibition. 2009.

Zhai, Y., et al., Thermodynamic analysis of the effect of channel geometry on heat transfer in double-layered microchannel heat sinks, in Energy Conversion and Management. 2017.

Asadi. A. and F. Pourfattah, Effects of constructal theory on thermal management of a power electronic system, in Scientific Reports. 2020. p. 21436.

Moita, A., A. Moreira, and J. Pereira, Nanofluids for the Next Generation Thermal Management of Electronics: A Review. Symmetry, 2021. 13(8): p. 1362.

Shang, B., et al., Passive thermal management system for downhole electronics in harsh thermal environmen Applied Thermal Engineering, 2017. 118: p. 593-599.

Garimella, S.V., L.-T. Yeh, and T. Persoons, Thermal management challenges in telecommunication systems and data centers. IEEE Transactions on Components, Packaging and Manufacturing Technology, 2012. 2(8): p. 1307-1316.

Hetsroni, G., et al., A uniform temperature heat sink for cooling of electronic devices. International Journal of Heat and Mass Transfer, 2002. 45(16): p. 3275-3286.

Abo-Zahhad, E.M., et al., Thermal Management of High Concentrator Solar Cell using New Designs of Stepwise Varying Width Microchannel Cooling Scheme, in Applied Thermal Engineering. 2020. p. 115124.

Rocha, L.A.O., S. Lorente, and A. Bejan, Constructal Theory in Heat Transfer, in Handbook of Thermal Science and Engineering. 2018, Springer International Publishing: Cham. p. 329-360.

Bejan, A., Advanced engineering thermodynamics. 2016: John Wiley & Sons.

Cheng, Q., et al., Precise nanoscale temperature mapping in operational microelectronic devices by use of a phase change material. Scientific reports, 2020. 10(1): p. 1-8.

* cited by examiner

128

THERMAL MANAGEMENT DEVICE FOR HIGH HEAT FLUX APPLICATIONS INCLUDING A MICROCHANNEL HEAT SINK ASSEMBLY AND METHOD FOR MANUFACTURING THE SAME

FIELD OF THE INVENTION

Embodiments of the present invention relate to the field of thermal management, particularly a thermal management device for high heat flux microelectronic application and a method manufacturing thereof.

BACKGROUND OF THE INVENTION

Background description includes information that will be useful in understanding the present invention. It is not an admission that any of the information provided herein is prior art or relevant to the presently claimed invention, or that any publication specifically or implicitly referenced is prior art.

Semiconductors are the primary material in the fabrication of any electronic device. Semiconductor devices and chips are used in data centers (DC), electronic information technology equipment (ITE), central processing units (CPU), Light-emitting diodes (LEDs), photovoltaic solar cells, and high concentrator solar cells (HCSC). The performance of all electronics manufactured from pure semiconductors (such as silicon or germanium) or compound semiconductors (such as gallium arsenide) is temperature-dependent. This is because the energy gap is temperature sensitive, which is one of the critical issues in solid-state quantum mechanics. Electronic devices' recommended operating temperature limitations are typically less than 85° C. for instance, photovoltaic solar cells (PV) are one of the most common semiconductors applications that experience performance deterioration when subjected to high-temperature conditions as each one Celsius degree increase in cell temperature cloud reduce the electrical efficiency up to 0.5%. Furthermore, the high heat flux combined with the high-temperature gradient reduces semiconductors' and electronic devices' performance, life, and reliability.

The rapid progress in semiconductor technology leads to exponential growth in these systems' power with very tightly packed and compactness levels. According to Moore's Law, the number of electronic components on a chip would double every two years. Furthermore, the rapid advancement of downsizing and high integration makes thermal management of modern electronic equipment extremely challenging. Each successive technology generation is distinguished by more powerful semiconductor devices, which accumulate more heat in related components, necessitating increased cooling requirements. Any upgrade in the power density of electronic devices poses the challenge of thermal management.

The three-dimensional distribution of heat from the device exhibits sub-millimeter hot spots with ultra-high local heat fluxes over a two-dimensional area of 5-10 mm² cases of thermal stresses and physical damages within the device architecture. Furthermore, the presence of local overheating and a significant degree of temperature gradient inside the chip decreased the signal-to-noise ratio (S/N), resulting in a rapid decline in device performance and dependability. Hence, it can be said that thermal management is considered the bottleneck to developing the semiconductor industries to maintain these high-power semiconductors chips under the desirable operation thermal condition.

Robust heat dissipation measures and thermal management solutions are essential for extending the lifespan of electronic devices' components. Thermal management of electronic devices has attracted tremendous attention to keep operating conditions under the recommended level of thermal loads.

The most widespread thermal management technologies and solutions can be classified into two main categories: active and passive cooling. Passive cooling (pump-free) includes natural air-cooling techniques, phase-change materials, and capillary-driven devices, e.g., heat pipes, capillary-pumped loops, and loop heat pipes. Although passive cooling strategies are cost-effective as no external power is required, the rapid advances in electronic devices need more robust and innovative cooling strategies. Moreover, obtaining an acceptable degree of nonuniformity with conventional passive cooling is hard for high-dense power devices.

Several experimental and mathematical studies explored using phase-change materials as an alternative solution to provide more effective and uniform active cooling. The phase-change materials can absorb and discharge a considerable amount of latent heat during the phase change from solid to liquid or vice versa. Thus, phase-change materials utilization has received increased attention recently because of its extensive use in thermal energy storage systems. Furthermore, the low melting point phase-change materials can be used for more uniform cooling systems as the temperature during the phase change is constant. However, phase-change materials cooling suffers many problems, such as low thermal conductivity, leakage, low thermal stability, and large footprint space. Besides, limitations of the maximum operating temperature of phase-change materials also represent an extra challenge of using phase-change materials for high heat fluxes applications.

In addition, the size restrictions make using passive cooling challenging in compact embedded systems. Active cooling presents an alternative to passive cooling for more intense cooling capabilities. The Microchannel heat sink is one of the advanced thermal management approaches that has been widely developed for electronics cooling. The key point in using the microchannel heat sink for the thermal management scheme is its remarkable capacity with the single-phase fluid because of scaling up the overall heat transfer area to volume ratio.

However, one of the downsides of the currently available active cooling systems, including the microchannel heat sink cooling systems, is the high-temperature gradient levels and flow maldistribution along the stream direction. In the microchannel heat sink, the heat generated by the electronic device is dissipated by a small volume of the working fluid. So, the fluid outlet temperature usually will be high, and the temperature distribution over the device is inhomogeneous and nonuniform.

Thus, there is a need to develop a new approach to overcome the shortcomings of thermal management systems and create a more robust, practical, simple, and cost-effective device. Hence, the present invention focuses on a thermal management device for high heat flux application.

SUMMARY OF THE INVENTION

Aspects of the disclosed embodiments seek to provide a robust thermal management device for high heat flux microelectronic applications and a manufacturing method.

Embodiments of the present invention relate to a thermal management device for high heat flux application comprising an integrated board, a microelectronic chip associated with the integrated board, a thermal interface materials component coupled to the micro-electronic chip for providing uniform cooling, a microchannel heat sink assembly physically connected to the thermal interface materials component thereby providing for the transfer of thermal energy from the integrated board and the microelectronic chip to the thermal interface materials component, at least four compartments connected to the housing in an upright position and a plurality of computational fluid dynamics tools to analyze the performance of the device. The arrangement of the compartments is selected to minimize the temperature differences across the integrated board and the microelectronic chip. Moreover, each of the four compartments is positioned parallel to the direction of gravitational force. Further, the thermal management device achieves less than 1K non-uniformity with a heat flow of up to 0.5 MW/m$^2$.

Following an embodiment of the present invention, the microchannel heat sink assembly comprises four headers for each inlet and outlet. The housing includes varied-width flow channels, adapted for increasing a heat transfer rate along a flowing stream, a metal mesh inserted within a streamline of the plurality of flow channels, and an adiabatic wall configured to allow heat to pass across. In particular, each flow channel's plurality is a multi-bifurcation microchannel. Moreover, the lowest channel's width is 1 mm (from the last stage to the outlets) and a maximum of 3.5 mm (from the inlets to the second stage). Further, the metal mesh is a structured micro-size metal mesh.

In accordance with an embodiment of the present invention, the heat sink assembly is configured with an area of 25 mm$^2$.

In accordance with an embodiment of the present invention, all four-compartments of the current heat sink are typically symmetrical.

In accordance with an embodiment of the present invention, the thermal management device further comprises a heat source, a heater, and a heat sink.

In accordance with an embodiment of the present invention, the thermal interface materials component includes anisotropic carbon-based interface materials.

According to an aspect of the invention, the method for manufacturing a thermal management device for high heat flux application comprising steps of associating a microelectronic chip with the integrated board, coupling a thermal interface materials component to the micro-electronic chip for providing uniform cooling, connecting a microchannel heat sink assembly physically to the thermal interface materials component thereby providing for the transfer of thermal energy from the integrated board and the micro-electronic chip to the thermal interface materials component, connecting the four compartments to the microchannel heat sink in the upright position and analyzing the performance of the device using a plurality of computational fluid dynamics tools.

In particular, the arrangement of the compartments is selected to minimize the temperature differences across the integrated board, and the microelectronic chip, each of the four compartments, is parallel to the direction of gravitational force.

Additional aspects of the invention will be outlined in part in the following description, and in position will be evident from the description or may be learned by practice of the invention.

BRIEF DESCRIPTION OF THE DRAWINGS

So that the manner in which the above-recited features of the present invention are understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The foregoing and other objects, features, and advantages of the present invention and the invention itself will be more fully understood from the following description of preferred embodiments, when read together with the accompanying drawings.

DETAILED DESCRIPTION

The present invention relates to an autonomous knowledge-based smart waste collection system for monitoring and collecting waste by optimizing a waste collection route. The present invention's principles and advantages are best understood in FIGS. 1A-8. In the following detailed description of illustrative or exemplary embodiments of the disclosure, specific embodiments in which the disclosure may be practiced are described in sufficient detail to enable those skilled in the art to practice the disclosed embodiments.

The following detailed description is, therefore, not to be taken in a limiting sense, and the scope of the present disclosure is defined by the appended claims and equivalents thereof. References within the specification to "one embodiment," "an embodiment," "embodiments," or "one or more embodiments" are intended to indicate that a particular feature, structure, or characteristic described in connection with the embodiment is included in at least one embodiment of the present disclosure.

Figure 1A:
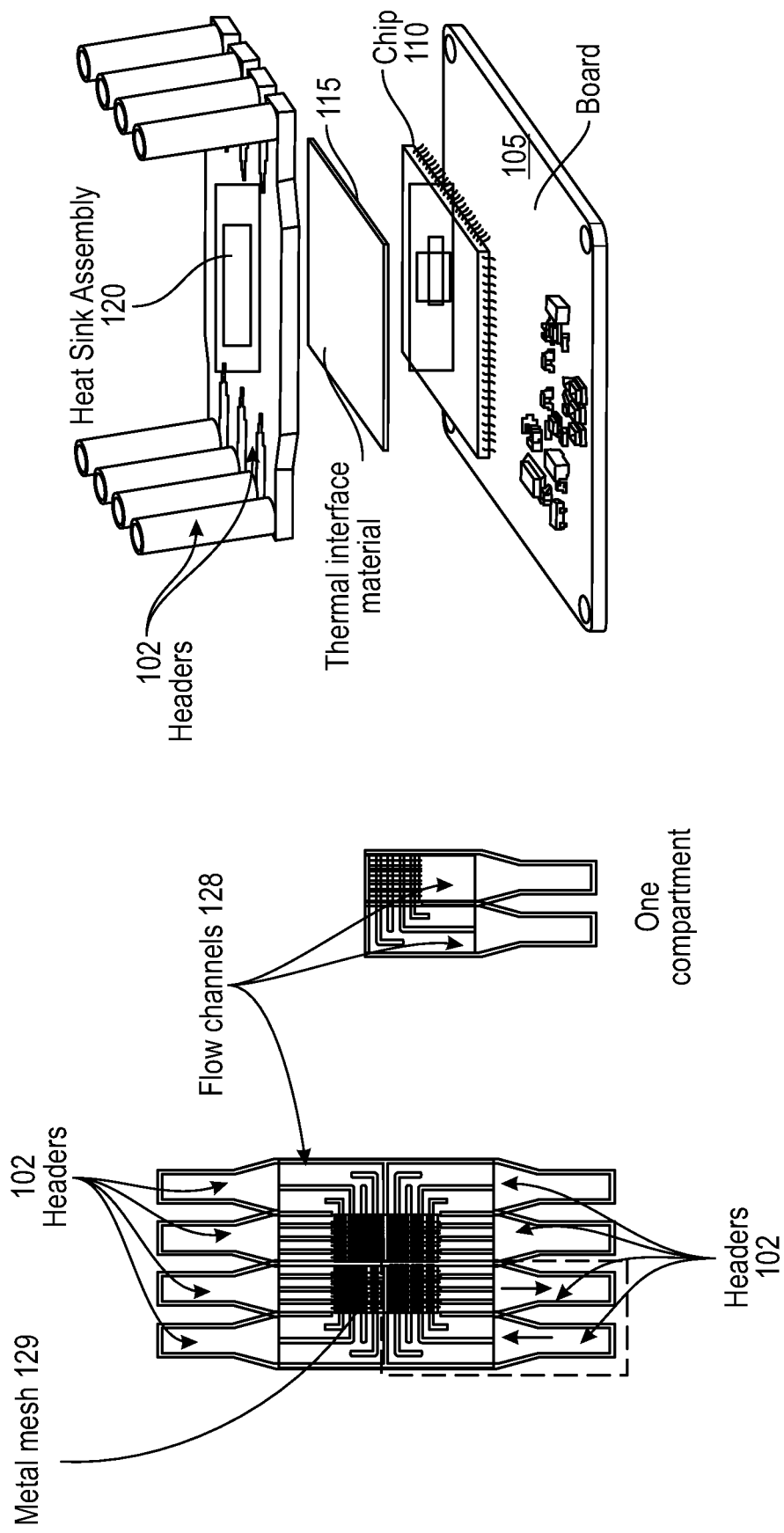
FIG. 1A depicts the microchannel heat sink assembly in accordance with the present invention.

Now simultaneously referring to FIGS. 1A to 4A, the various embodiments of the thermal management device (100) for high heat flux application are elaborated below. FIG. 1A shows the microchannel heat sink assembly (120) in accordance with the present invention. In accordance with the present invention, the proposed design has four compartments. Each compartment has one inlet and one outlet as shown in FIG. 1A. For the proposed design with four compartments, four inlets and four outlets are used, and in case only two compartments are used, two inlets and two outlets are needed.

Figure 1B:
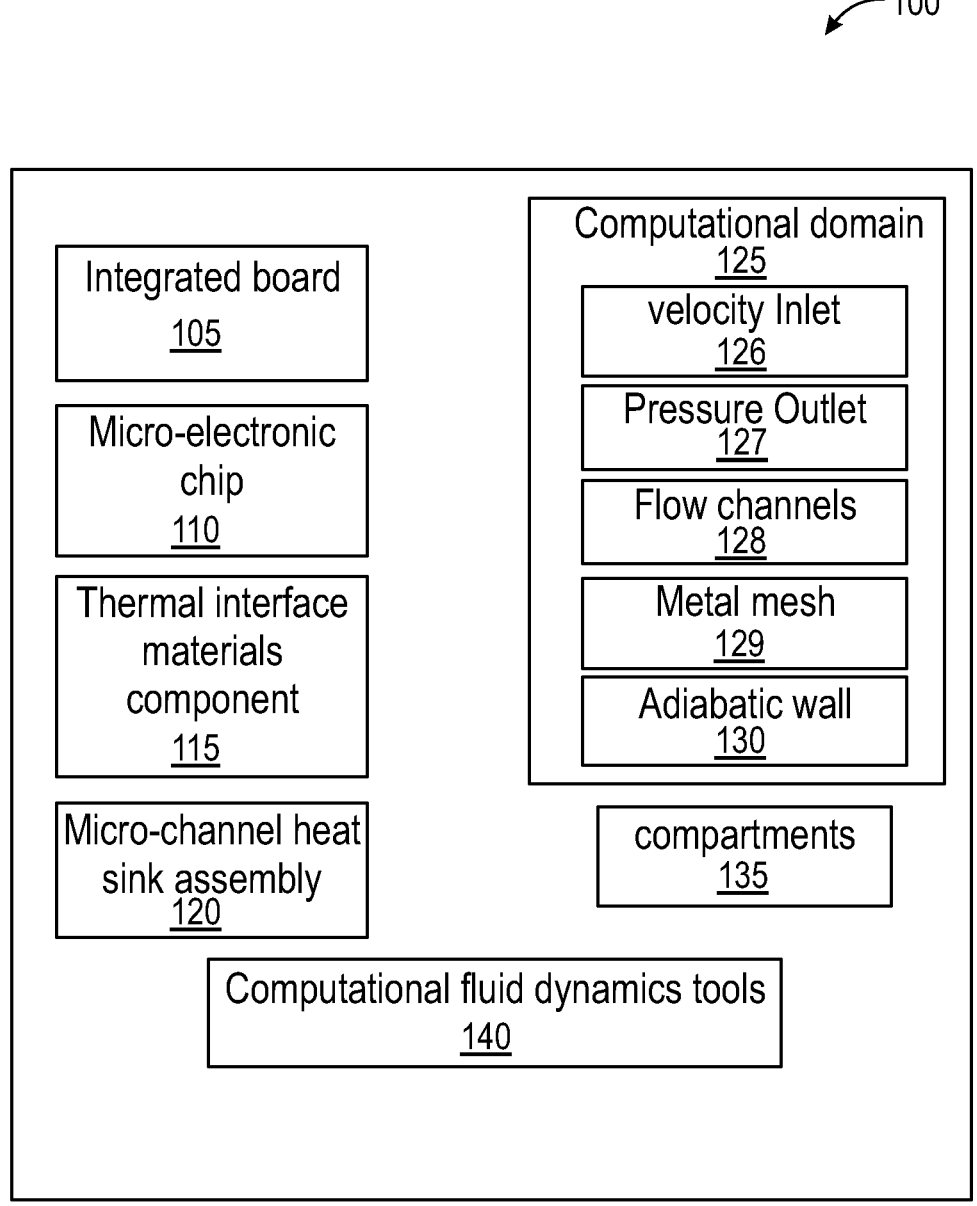
FIG. 1B is a block diagram illustrating components of a thermal management device within which various aspects of the present disclosure can be implemented in accordance with one or more embodiments of the present invention.

FIG. 1B is a block diagram illustrating components of the thermal management device for high heat flux application for a microelectronic device to extract excess heat from highly dense and compact power electronics devices in accordance with one or more embodiments of the present invention. The thermal management device (100) includes an integrated board (105), a micro-electronic chip (110) associated with the integrated board (105), a thermal interface materials component (115) coupled to the micro-electronic chip (110) for providing uniform cooling, a microchannel heat sink assembly (120) physically connected to the thermal interface materials component (115), and a plurality of computational fluid dynamics tools (140) configured to analyze the performance of the thermal management device (100).

The microchannel heat sink assembly (120), showing a computational domain/housing (125) with at two inlets (126), and at two outlets (127), a plurality of flow channels (128) adapted for increasing a heat transfer rate along the flow stream, a metal mesh (129) inserted within a streamline of the plurality of flow channels (128), the adiabatic wall (130) configured to allow heat to pass across, and at least four compartments (135) connected to the housing (125) in the upright position. In particular, the arrangement of the four compartments (135) is selected to minimize the temperature differences across the integrated board (105) and the microelectronic chip (110). Moreover, each compartment (135) is positioned parallel to the direction of gravitational force.

In accordance with an embodiment of the present invention, the flow channels (128) are multi-bifurcation microchannels that increase the heat transfer rate along the flow stream.

In accordance with the embodiment of the present invention, the metal mesh (129) is a structured micro-size metal mesh. The structured micro-size metal mesh inserts within the streamline increase the heat transfer rate, which helps the thermal management device (100) to manipulate heat dissipation for high-density power devices and prevent the development of hotspots with microelectronic devices.

In accordance with an embodiment of the present invention, the thermal interface materials component (115) is an anisotropic carbon-based thermal interface material. The anisotropic carbon-based thermal interface material may be but is not limited to ultrathin carbon-based thermal interface materials. Alternatively, the thermal interface materials component may include any other known or to-be-developed anisotropic carbon-based thermal interface materials. In addition, the thermal interface materials component (115) may have multi-bifurcation across the thermal management device (100) and along each channel, ensuring uniform cooling robustness.

In accordance with an embodiment of the present invention the inlets (126) boundary is a velocity inlet, and the outlets (127) boundary is a pressure outlet.

In accordance with an embodiment of the present invention, the microelectronic device is any known or to-be-developed microelectronic device with a high-power density to achieve sufficient temperature uniformity while maintaining low-pressure drop levels. The thermal management device (100) is configured for highly dense power applications and provides a uniform cooling system under laminar flow conditions. In particular, the thermal management device (100) splits up potential hot spots resulting in more uniform cooling and less thermal loads in tight and dense-packed semiconductors operating under dense power.

In accordance with an embodiment of the present invention, the thermal management device (100) achieves less than 1 K non-uniformity with a heat flow of up to 0.5 MW/m$^2$.

In accordance with an embodiment of the present invention, the thermal management device (100) has a Nusselt number (Nu) up to 56 at laminar flow conditions.

Figure 2:
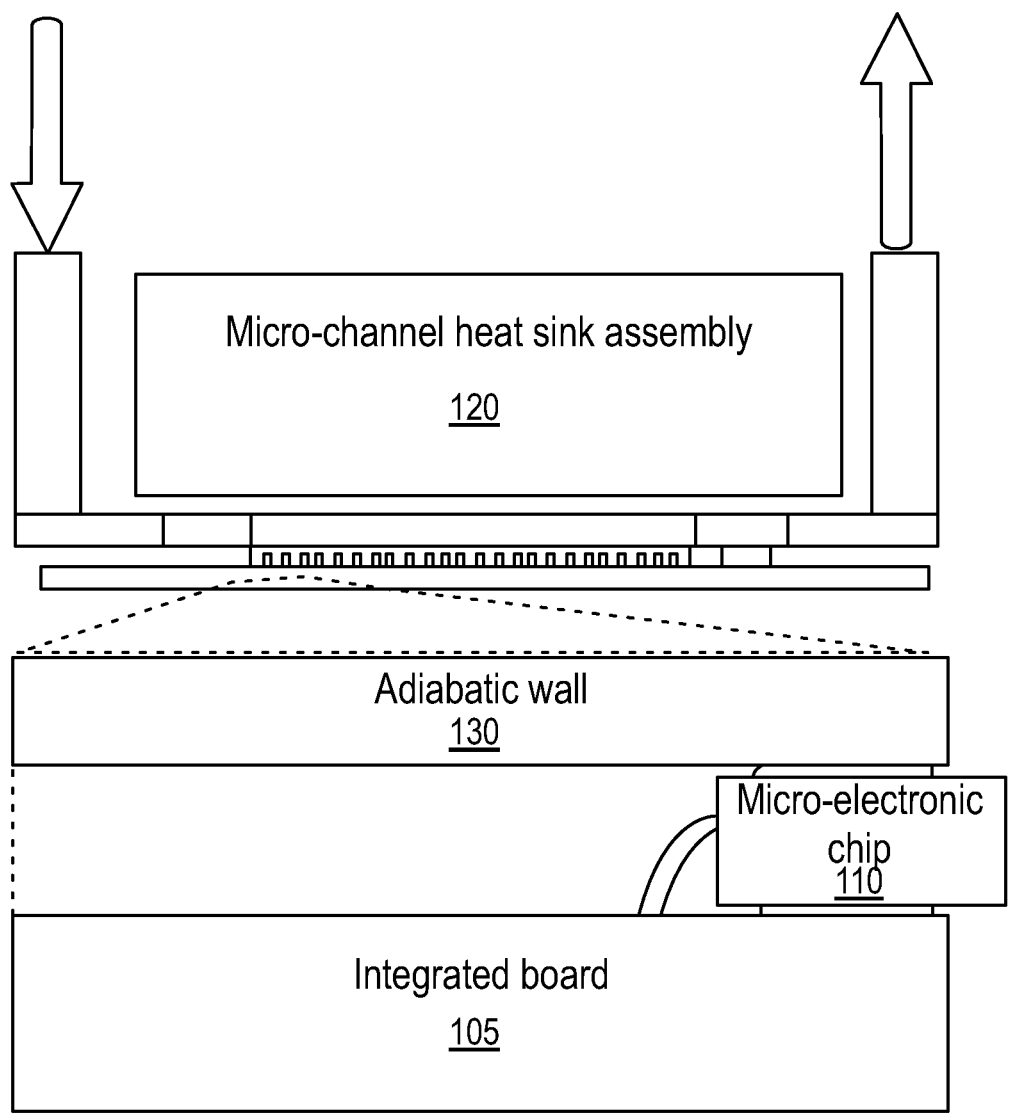
FIG. 2 is a schematic diagram illustrating a side view of a microchannel heat sink assembly of the thermal management system in accordance with an embodiment of the present invention.
Figure 3A:
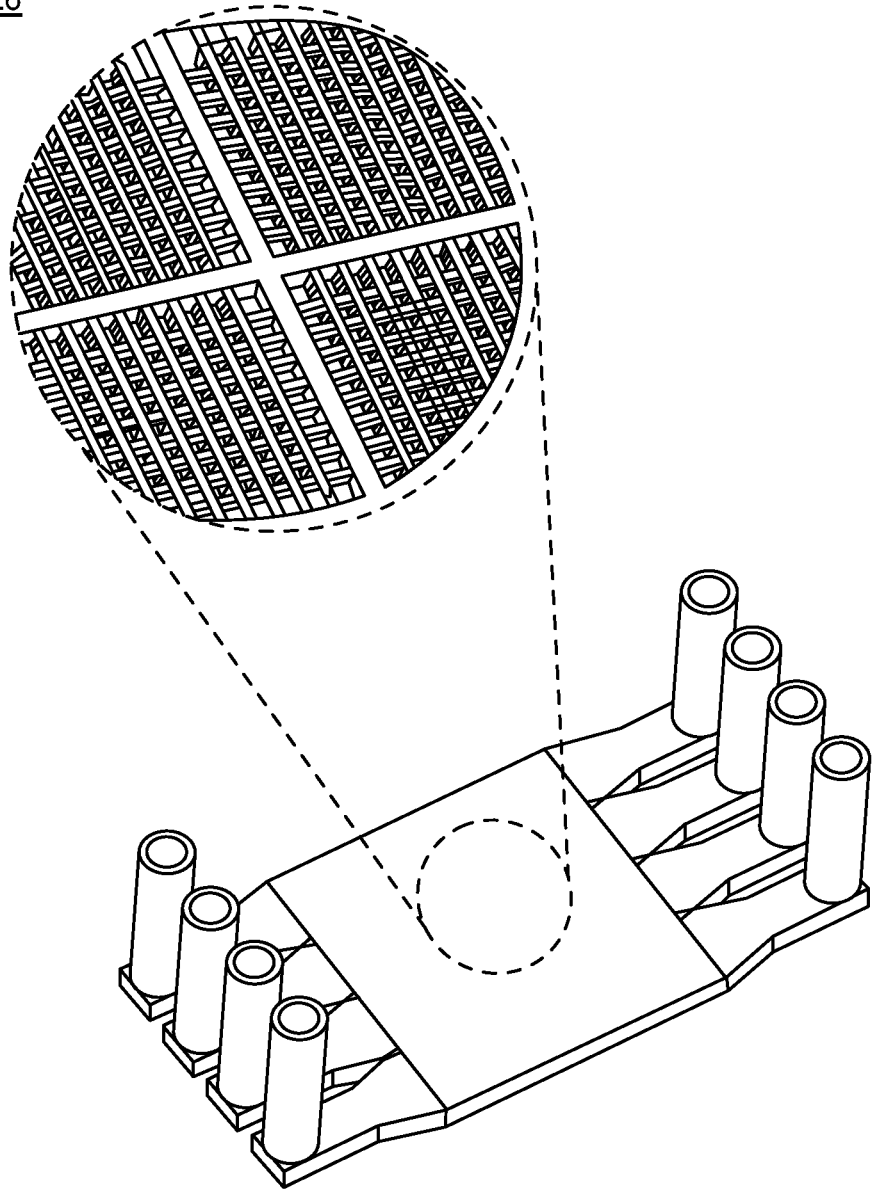
FIG. 3A is an isometric view illustrating the magnification of the internal channel structure in accordance with an embodiment of the present invention.
Figure 3B:
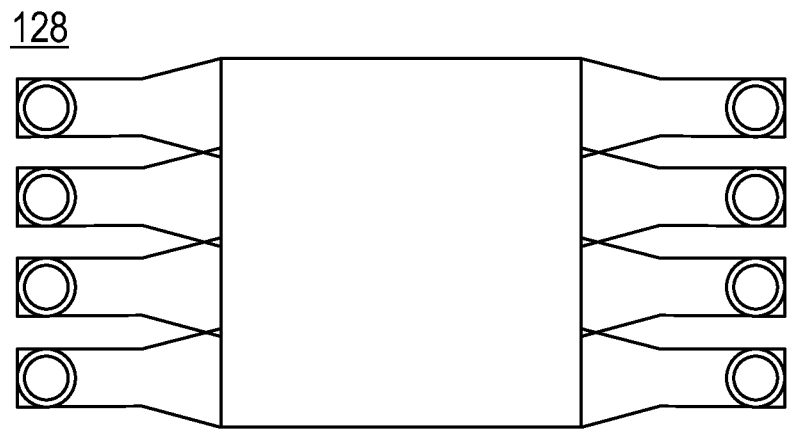
FIG. 3B is a top view of the channel structure in accordance with an embodiment of the present invention.
Figure 3C:
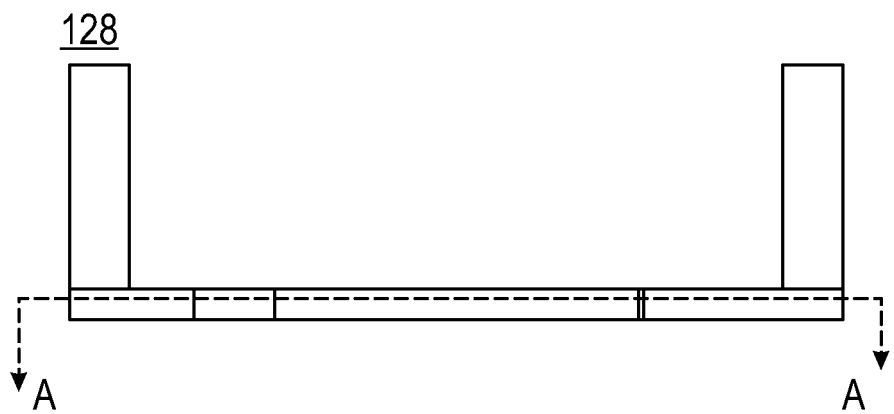
FIG. 3C is a side view of the channel structure in accordance with an embodiment of the present invention.
Figure 3D:
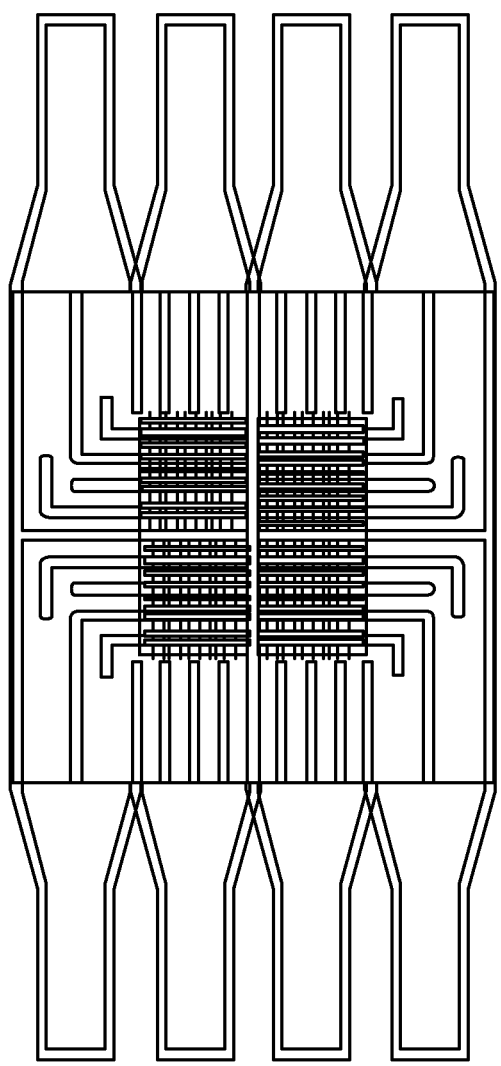
FIG. 3D is a cross-sectional view of the channel structure in the middle of the coolant domain in accordance with an embodiment of the present invention.

FIG. 2 is a schematic diagram illustrating a microchannel heat sink assembly (120) of the thermal management system (100) in accordance with an embodiment of the present invention. In this embodiment, the microchannel heat sink assembly (120) has a microelectronic chip (110) in the integrated board (105). The microelectronic chip (110) is a highly dense power microelectronic chip. Moreover, the microchannel heat sink assembly (120) is configured with one or more highly dense power micro-electronic chips. Further, the highly dense power micro-electronic chip area is 25 mm$^2$.

In accordance with an embodiment of the present invention, the microchannel heat sink assembly (120) is a four-compartment microchannel heat sink assembly with symmetrical areas. In particular, the microchannel heat sink assembly (120) is physically connected to the thermal interface materials component (115), thereby transferring thermal energy from the integrated board (105) and the microelectronic chip (110) to the thermal interface materials component (115). Further, the thermal management device (100) transfers heat swiftly by removing frontiers that could restrain heat transfer. In accordance with an embodiment of the present invention, the microchannel heat sink assembly (120) may be a monolithic metal-based microchannel heatsink.

FIGS. 3A-3D are different views of the channel structure in accordance with various embodiments of the present invention. The plurality of flow channels (128) is adapted for increasing a heat transfer rate along the flow stream. Moreover, a metal mesh (129) is inserted within a streamline of the plurality of flow channels (128) for heat transfer density. The narrowest channel of the plurality of flow channels has a width of 1 mm (from the last stage to the outlets) and a maximum of 3.5 mm (from the inlets to the second stage). The channel dimensions and geometries are designated considering the constraints of 3D metal printing and pumping requirements.

Figure 4A:
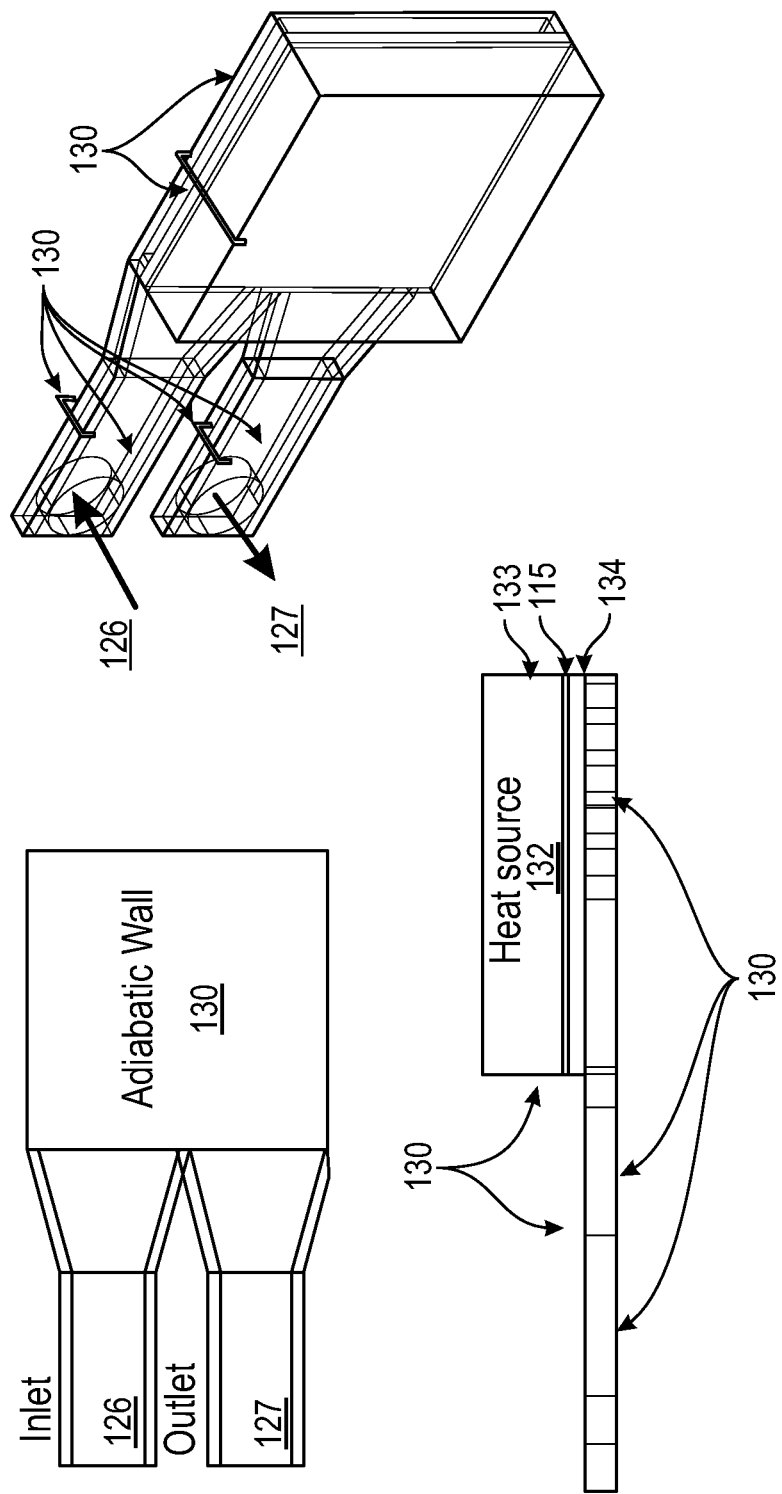
FIG. 4A illustrates schematic representations of the computational fluid dynamics (CFD) domains in no-slip boundary conditions in accordance with an embodiment of the present invention.
Figure 4B:
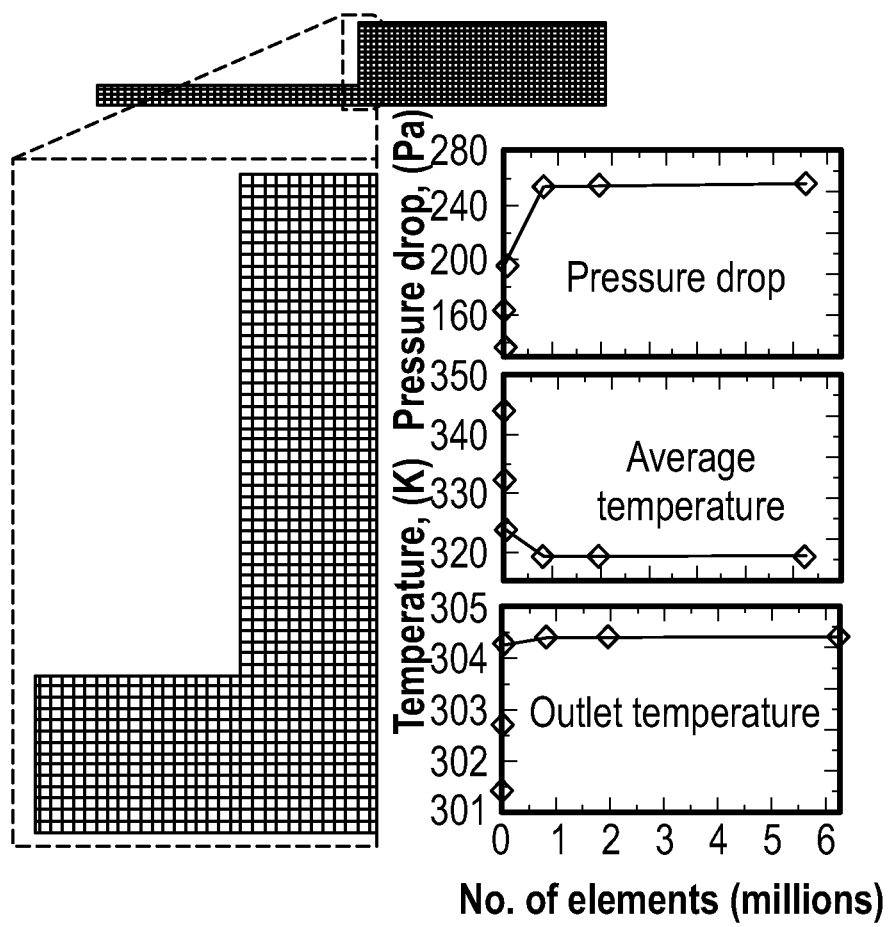
FIG. 4B illustrates a graphical representation of the CFD domain grid of the four-compartment microchannel heat sink and the grid sensitivity test in accordance with an embodiment of the present invention.

FIG. 4A illustrates schematic representations of the CFD domains in no-slip boundary conditions in accordance with an embodiment of the present invention. The thermal management device (100) shown in FIG. 4A includes the inlet (126), outlet (127), heat source (132)/heater (133), heat sink (134), and thermal interface materials component (115). FIG. 4B illustrates a graphical representation of the CFD domain grid of the four-compartment microchannel heat sink and the grid sensitivity test in accordance with an embodiment of the present invention. The grid sensitivity test includes average device temperature, outlet temperature, and pressure drop. The CFD domains used in the CFD calculations and boundary conditions are defined on solid-liquid interfaces (not depicted).

The three-dimensional Computational fluid dynamic (CFD) simulation is performed at steady-state, incompressible, and laminar flow (100<Re<1500). The solid and fluid domains are simulated by solving the governing equations of continuity, momentum, and energy for fluid flow, convection, and conduction heat transfer equations for solid. A heat generation term was added to the energy equation for the solid domain as a heat source (electronic device). The source term is added to the energy equation as a function of the device temperature to exclude the losses due to natural convection. The boundary conditions used in the numerical model imposed velocity and pressure outlets at the inlet and exit, respectively. The top, sides, and bottom surfaces of computational domains are considered adiabatic, neglecting the convection and the radiation heat loss.

Figure 5:
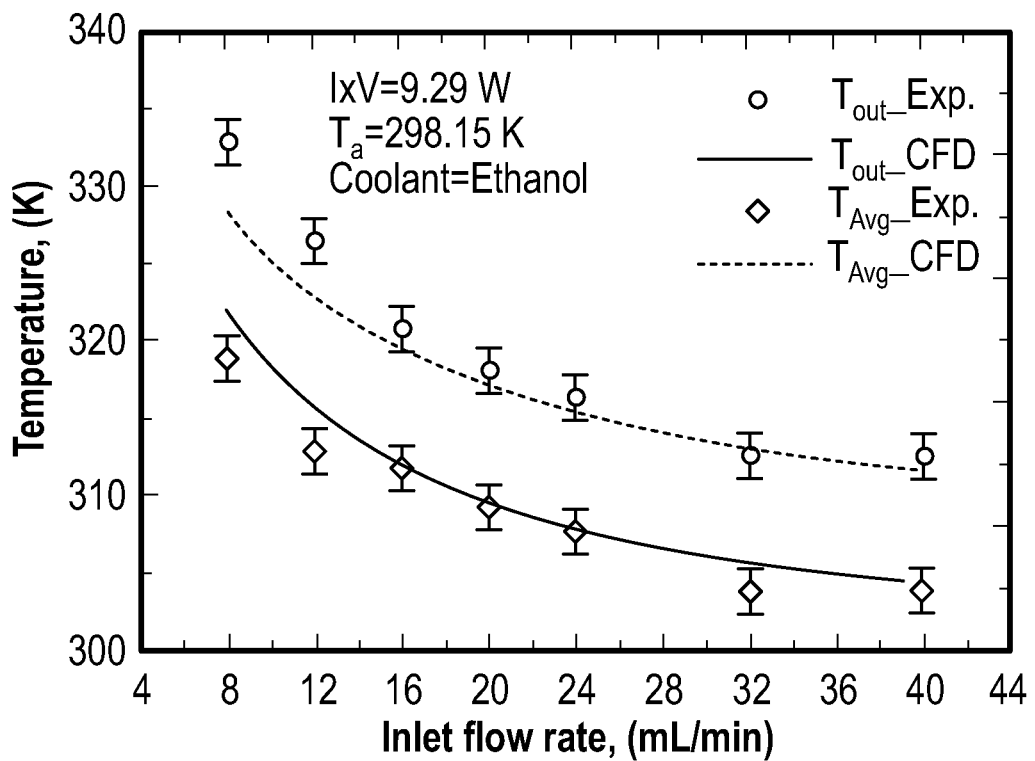
FIG. 5 illustrates a graph of the four-compartment microchannel heat sink at different coolant flow rates in accordance with an embodiment of the present invention.

FIG. 5 illustrates a graph of the four-compartment microchannel heat sink at different coolant flow rates in accordance with an embodiment of the present invention. In particular, it shows a comparison of the experimental and CFD data. Moreover, the graph shows that when the flow rate ranges between 8-40 ml/min under the same conditions, the average variation between experimental and mathematical data is <1% for average wall temperature and outlet temperature, respectively. Further, the CFD model is validated through practical investigations utilizing water as a single-phase coolant.

FIGS. 6A-6D illustrates graphs showing the comparative effect of the thermal management device (100) compared with the traditional microchannel heat sink on Reynolds number under the same conditions (Device temperature, device temperature nonuniformity, Outlet temperature, and pressure drop within the device) to highlight the thermal management device (100) potential. As inferred from the graphs of FIGS. 6A-6D, the thermal management device (100) achieves thermal management potentials at low operating temperatures and has low nonuniformity with low-pressure drop burdens compared with the traditional microchannel heat sink. Moreover, the thermal management device (100) can operate at laminar flow and achieve a low device operation temperature of less than 315 K with a nonuniformity degree of less than 0.75 K or more minor. Further, the thermal management device (100) shows an 85% reduction in the wall temperature nonuniformity compared to the traditional microchannel heat sink. Furthermore, the thermal management device (100) achieves an average Nusselt number (Nu) of about 56, whereas the maximum reported Nusselt number (Nu) in the traditional microchannel heat sink is about 44.

Figure 6A:
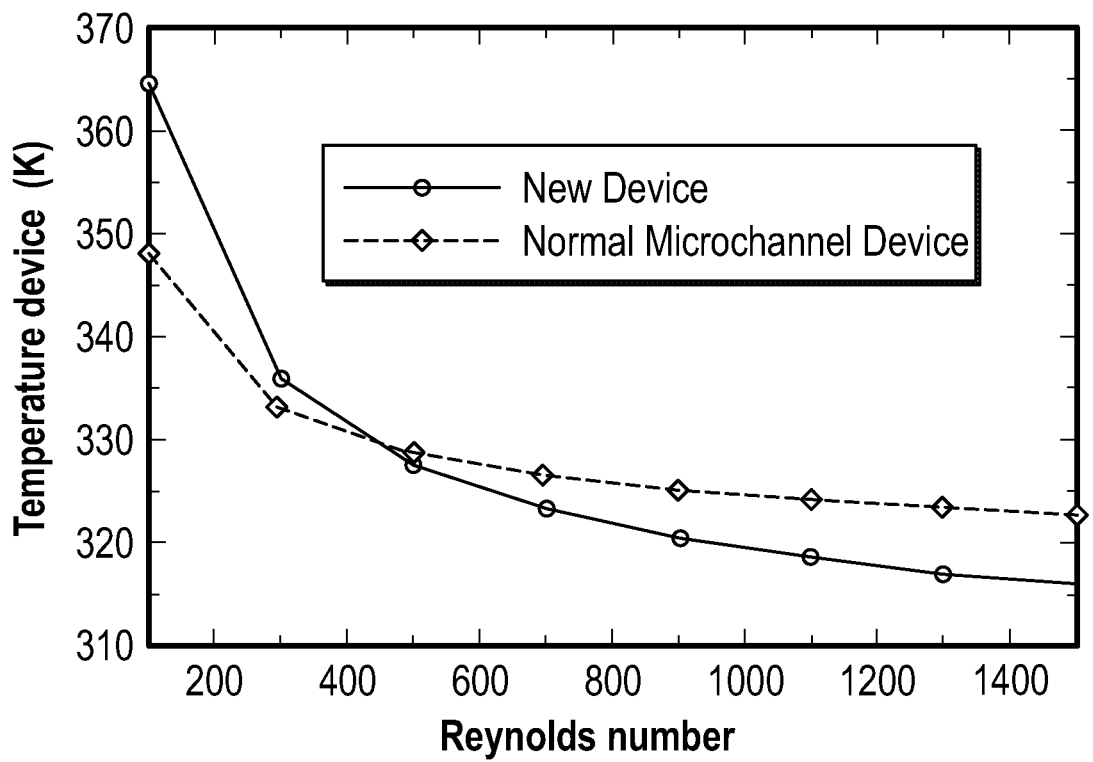
FIG. 6A is a graph illustrating the effect of the Reynolds number on the device temperature with a four-compartment microchannel heat sink and the standard straight microchannel heat sink in accordance with an embodiment of the present invention.
Figure 6B:
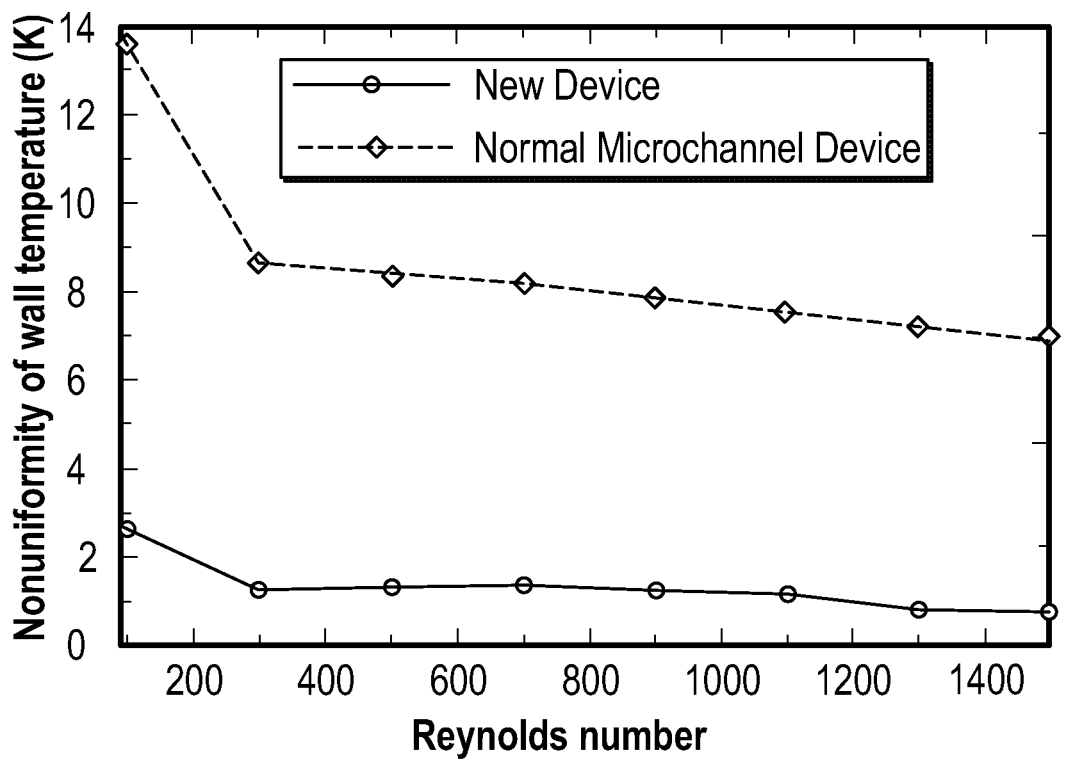
FIG. 6B is a graph illustrating the effect of the Reynolds number on the device temperature nonuniformity of the thermal management device having a four-compartment microchannel heat sink and the normal straight microchannel heat sink in accordance with an embodiment of the present invention.
Figure 6C:
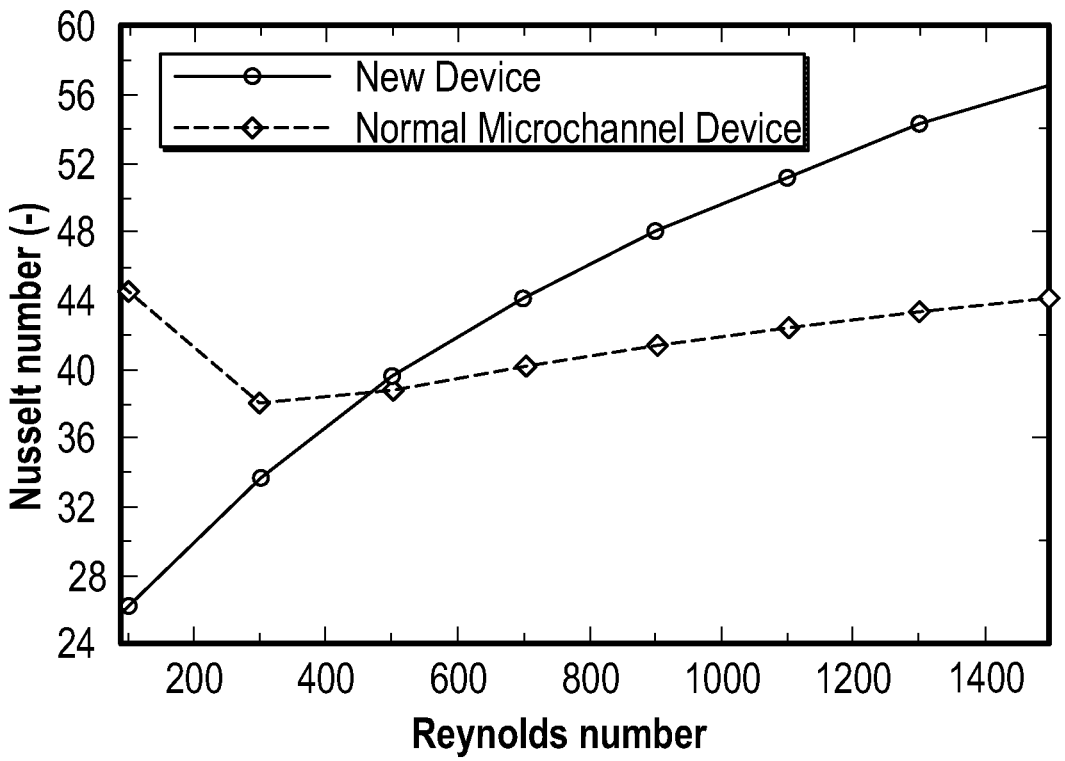
FIG. 6C is a graph illustrating the effect of the Reynolds number on the outlet temperature of the thermal management device having a four-compartment microchannel heat sink and the normal straight microchannel heat sink in accordance with an embodiment of the present invention.
Figure 6D:
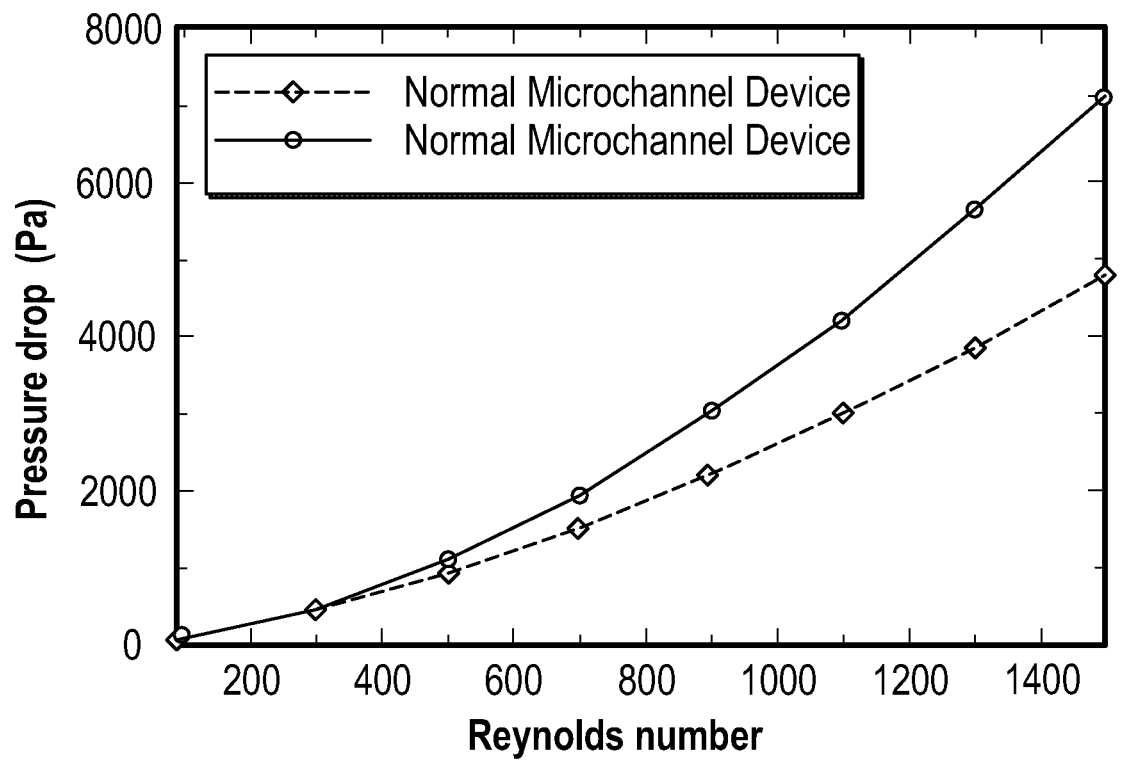
FIG. 6D is a graph illustrating the effect of the Reynolds number on the pressure drop of the thermal management device having a four-compartment microchannel heat sink and the normal straight microchannel heat sink in accordance with an embodiment of the present invention.
Figure 7A:
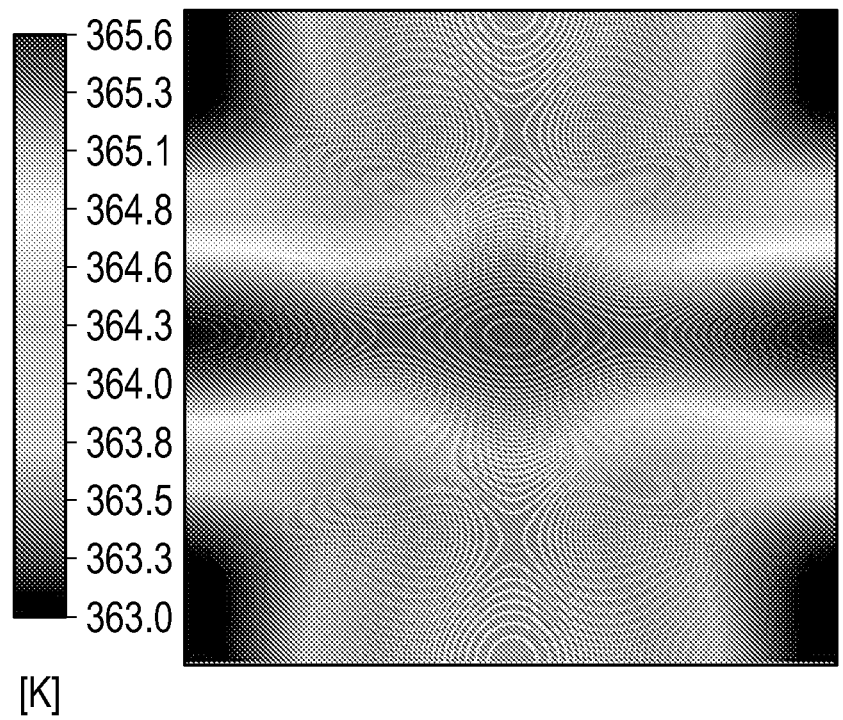
FIG. 7A shows the contours of the predicted local temperature distribution over the semiconductor device when the thermal management device is used for thermal management at a Re of 100 in accordance with an embodiment of the present invention.

The thermal management device (100) has a higher Re of 1500, as shown in FIG. 6C; thus, the thermal management device (100) is 28% better than the traditional microchannel heat sink (c). Further, it is also evident from FIG. 6D that the thermal management device (100) does not have many pressure drops. FIG. 7A shows contours at Q=125 W and $T_{in}$=293 K of the predicted local temperature distribution over the semiconductor device when a thermal management device (100) is used for the thermal management at Re of 100 and Re of 1500 in accordance with one or more embodiments of the present invention. In particular, the existence of the metallic structure significantly increases the heat transfer rates and breaks down any hot spot occurring at the device center. Further, as revealed in the contours, the impact of the arranged metal mesh is very slight at low Re values, and at high Re values, the metal mesh routes the hot spot from the center.

Figure 7B:
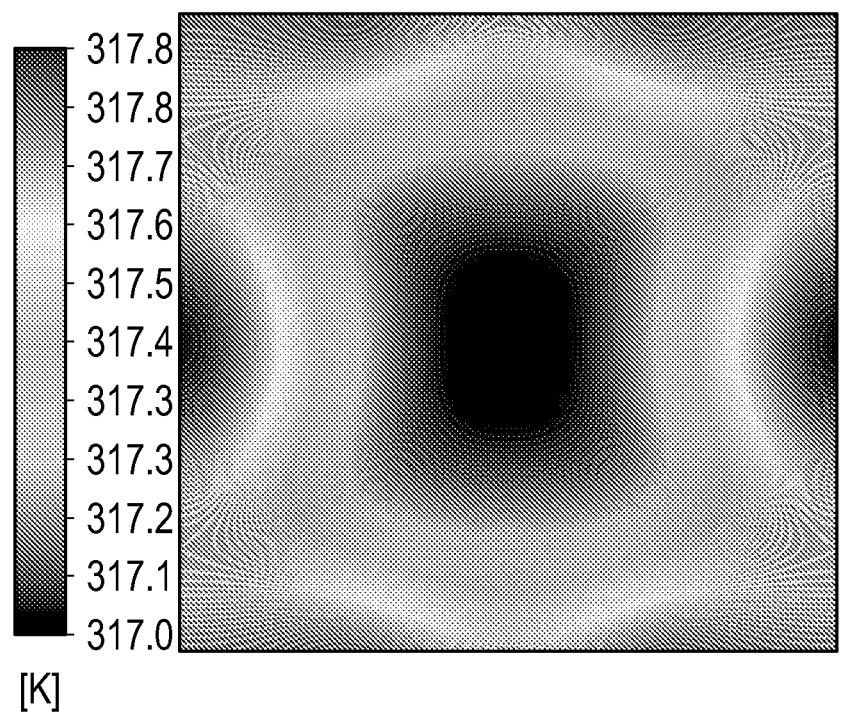
FIG. 7B shows the contours of the predicted local temperature distribution over the semiconductor device when the thermal management device is used for the thermal management at Re of 1500 in accordance with an embodiment of the present invention.
Figure 8:
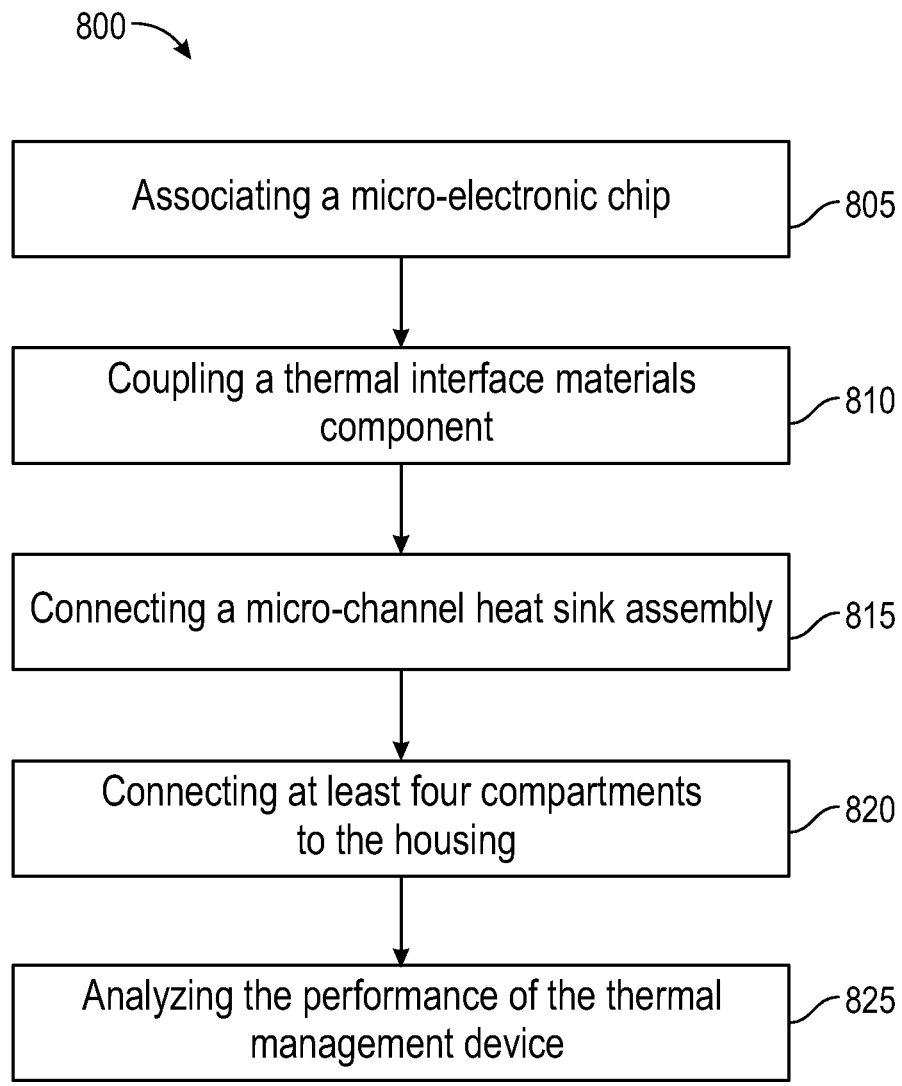
FIG. 8 is a flow chart illustrating a method for manufacturing a thermal management device for high heat flux application in accordance with an embodiment of the present invention.

As shown in FIG. 7B, the elevated temperature areas near the device edges illustrate low thermal stresses. Thus, outstanding nonuniformity within the thermal management device (100) guarantees the thermal management device (100) high performance along with a long lifespan. FIG. 8 is a flow chart illustrating a method for manufacturing a thermal management device for high heat flux application in accordance with an embodiment of the present invention. The method starts at step 805 and proceeds to 810-820. At step 805, a micro-electronic chip (110) is associated with an integrated board (105). At step 810, a thermal interface materials component (115) is coupled to the micro-electronic chip (110) to provide uniform cooling. At step 815, a microchannel heat sink assembly (120) is physically connected to the thermal interface materials component (115) to provide for the transfer of thermal energy from the integrated board (105) and the microelectronic chip (110) to the thermal interface materials component (115).

At step 820, the four compartments to the housing (125) are connected in an upright position. The arrangement of the compartments is selected to minimize the temperature differences across the integrated board (105) and the microelectronic chip (110). At step 825, the performance of the thermal management device (100) is analyzed with a plurality of computational fluid dynamics tools (140). Advantageously, the thermal management device (100) has a well-engineered cooling system and optimized designs to reduce power expenditure. It is lightweight, has low operating costs, low operating temperatures, and higher device performance, and completely breaks the creation of possible local hot spots.

Moreover, the thermal management device (100) provides single-phase and uniform cooling for semiconductors with a power density of up to 0.25 MW/m². Further, the new and innovative thermal management device (100) incorporates fewer thermal strains within semiconductor devices. It also allows the first application of 3D printing to fabricate monolithic devices suitable for the thermal management of high and dese power microelectronic devices.

The main objective of the current concept is to develop and evaluate the performance of an innovative thermal management system for high dense power applications. The current design is a pioneer invention in the semiconductor industry offering a nearly uniform cooling system under laminar flow conditions. In the current study, a design based on constructal law was used to adapt a simple mini-size straight channels heat sink device. A structured micro-size metal mesh was inserted within the streamline. Different cases were studied by dividing the channel length into three zones with the same inlet and outlet. The regeneration of the boundary layer by varying the channel geometry is achieved to avoid and break up any hot spots within the device. FIG. 2 shows the schematic diagram for the proposed microchannel heat sink assembly with a chip in an integrated board.

Thermal management techniques based on constructal theory are used in the current work to meet the thermal management requirement of dense and tightly package microelectronic devices. The constructal Law as well known is a law of physics states that: "For a finite-size flow system to persist in time (to live), its configuration must change in time such that it provides easier access to its currents (fluid, energy, species, etc.)". The current work philosophy is to let the heat morph free and transfer swiftly by removing any frontiers that could restrain the heat transfer. The innovative heat sink design (for convection) along with the cutting-edge carbon-based thermal management material (for conduction) are applied toward more efficient heat transfer. The implementation and fabrication of multi segments (dividing the MCHS into typical symmetrical four areas) along with multi-bifurcations microchannel heat sinks was adopted to thoroughgoing heat transfer density. The thought comes from the conclusions of several previous literature works that the maximum local temperature and hot spots normally happen in the device center. Furthermore, the multi-bifurcations of the cooling system prove great local heat transfer rates with satisfactory pumping requirements especially when local hot spots exist. In addition, high-temperature uniformities could be achieved when the TIM is used which is discussed further in the next section. Based on Constructal theory and the TIM promises, a four-compartment microchannel heat sink (4CMCHS) with multi-bifurcations is proposed toward a more robust thermal management system of the high dense power micro-electronic chips. The 4CMCHS bounded to a 25 mm² high-performance chip. The channels dimensions and geometries are designated considering the constraints of 3D metal printing and pumping requirements. The lowest channel width in the current work is 1 mm (from the last stage till the outlets) and the maximum is 3.5 mm (from the inlets till the second stage).

Extracting the excess heat from extremely high dense and compact power electronics chips is one of the main challenges of semiconductors and electronic industries. Moreover, the recent advances in tightly packed chips require more sophisticated thermal management practices than the traditional ones. The main objective of this invention is to develop and test the performance of an innovative thermal management approach for high dense power applications. The current concept aims to split up any potential hot spots, resulting in more uniform cooling and less thermal loads. In this invention, a new approach for thermal management of tight and dense-packed semiconductors that operate under dense power is introduced. The proposed thermal management is based on three alternative heat routing design concepts. First, the heat sink is designed as four compartments microchannel heat sink with typical symmetrical areas. Second, the flow channels are multi-bifurcation microchannels that increase the heat transfer rate along the flow stream. Thirdly, a structured micro-size metal mesh was inserted within the streamline. Finally, anisotropic carbon-based thermal interface materials are used to provide more uniform cooling. Computational fluid dynamics tools are used to thoroughly analyze the performance of the suggested device to meet the current work objectives. The consistency between numerical and experimental data is good, with the highest variance being less than 1%. Numerical investigations are also conducted to study the effect of thermal interface material type and qualities, as well as coolant type, on the local temperature distribution. As the local temperatures were reduced, it was discovered that the thermal interface materials successfully broke up any potential for the formation of local hot spots. With a heat flow of up to 0.5 MW/m², the device achieved less than 1 K non-uniformity. The findings achieved utilizing the proposed approach clearly demonstrate the advantages of employing these new thermal management procedures for extracting excess heat from extremely dense and compact power electronics devices.

The current study's findings reveal that the proposed thermal management system for any microelectronic device with a high-power density achieves sufficient degrees of temperature uniformity while maintaining low pressure drop levels. Furthermore, anisotropic materials with high thermal conductivity in-plane directions but poor thermal conductivity through-plane directions were manipulated. The high values of the in-plane help to simultaneously dissipate heat from a hotspot and reduce the temperature gradient within the heat source. This significantly reduces thermal strains within the gadget construction, extending its life. This device can be used for CPU ships and high concentration solar cells that works under concentration ratios up to 1000 suns. The benefits of using this innovative thermal management approach have been demonstrated in this invention using this new concept for extracting excess heat from extremely dense and compact power electronics devices.

The present design includes engineered cooling systems and optimized designs to reduce power expenditure while remaining light weight and low in cost, as well as verification of component designs employed in them. The main challenge is to reduce the power consumption of thermal management systems without compromising on cooling performance and reliability. High heat rates dissipation is a critical factor in the designing of different electronic systems which is extremely critical to increase clock rate and microprocessor transistor count for example. The current invention has several advantages for the microelectronic industry and high concentration photovoltaic companies. Compared to traditional technologies, this invention results in resolving one of the constraints in the development of the semiconductor industries by implementing effective thermal management systems with low operating costs, completely breaking the creation of possible local hot spots, achieves single phase and uniform cooling for semiconductor device with power density up to 300 KW/m² and low operating temperatures and higher device performance. This new and innovative design incorporates fewer thermal strains within semiconductor devices.

In view of the above, it will now be appreciated that the elements of the block diagram and flowcharts support combinations of means for carrying out the specified functions and processes, combinations of steps for performing the specified functions and procedures, program instruction means for performing the specified functions and operations, and so on. The invention is capable of various modifications in various apparent aspects, all without departing from the spirit and scope of the present disclosure. Accordingly, the drawings and descriptions are to be regarded as illustrative in nature and not restrictive.

The features described herein may be combined to form additional embodiments, and sub-elements of particular embodiments may include further embodiments. The previous summary of the present disclosure with the preferred embodiment should not be construed to limit the scope of the invention. It should be understood and apparent to one skilled in the art that the embodiments of the invention thus described may be further modified without departing from the spirit and scope of the invention.

The invention claimed is:

1. A thermal management device for high heat flux application in a microelectronic device by extracting excess heat from the microelectronic device, wherein the thermal management device comprising:
   an integrated board;
   a microelectronic chip associated with the integrated board;
   a thermal interface material component coupled to the microelectronic chip for providing uniform cooling; and
   a microchannel heat sink assembly operatively connected to the thermal interface material component for transferring thermal energy from the integrated board material B and the microelectronic chip to the thermal interface material component, wherein the microchannel heat sink assembly comprises a housing with at least two inlets and at least two outlets, an adiabatic wall configured to allow heat to pass across the microchannel heat sink assembly, a plurality of flow channels of varying width adapted for increasing a heat transfer rate along a flow stream and a metal mesh inserted within a streamline of the plurality of flow channels.

2. The thermal management device of claim 1, wherein the housing further comprises:
   at least four compartments connected to a header in an upright position wherein an arrangement of at least four compartments is selected to minimize temperature differences across the integrated board and the microelectronic chip; and
   a plurality of computational fluid dynamics tools configured to analyze the performance of the thermal management device, wherein each of the at least four compartments is positioned parallel to the direction of gravitational force.

3. The thermal management device of claim 1, wherein the microchannel heat sink assembly is a four-compartment microchannel heat sink assembly with symmetrical areas, and each of the plurality of flow channels is a multi-bifurcation microchannel.

4. The thermal management device of claim 2, wherein the metal mesh is a structured micro-size metal mesh.

5. The thermal management device of claim 1, wherein the thermal interface material component is an ultrathin anisotropic carbon-based thermal interface material.

6. The thermal management device of claim 1, wherein the thermal management device achieves a Nusselt number (Nu) up to 56 at laminar flow conditions.

7. The thermal management device of claim 1, wherein each of the at least two inlets are velocity inlets and each of the at least two outlets are pressure outlets.

8. The thermal management device of claim 1, wherein the microchannel heat sink assembly is configured with one or more high-performance and high-dense power microelectronic chips with an area of 25 mm² chip.

9. The thermal management device of claim 1, wherein the thermal management device achieves less than 1 K non-uniformity with a heat flow of up to 0.5 MW/m².

10. The thermal management device of claim 1, wherein the lowest channel of the plurality of flow channels has a width of a minimum of 1 mm and a maximum of 3.5 mm.

11. The thermal management device of claim 1, wherein the thermal management device comprises a heat source with a heater and a heat sink.

12. A method of manufacturing a thermal management device for a high heat flux application in a microelectronic device comprising the steps of:
   associating a microelectronic chip with an integrated board;
   coupling a thermal interface materials component to the microelectronic chip for providing uniform cooling; and
   connecting a microchannel heat sink assembly physically to the thermal interface materials component, thereby transferring thermal energy from the integrated board and the micro-electronic chip to the thermal interface materials component,
   the microchannel heat sink assembly comprising a housing with at least two inlets and outlets, an adiabatic wall configured to allow heat to pass across the microchannel heat sink assembly, a plurality of flow channels of varying width adapted for increasing a heat transfer rate along a flow stream and a metal mesh inserted within a streamline of the plurality of flow channels.

13. The method of claim 12 further comprises:
   connecting at least four compartments to headers in an upright position wherein an arrangement of the compartments is selected to minimize the temperature differences across the integrated board and the microelectronic chip, and each of the four compartments are positioned parallel to the direction of gravitational force; and
   analyzing the performance of the thermal management device with a plurality of computational fluid dynamics tools, wherein the thermal management device achieves less than 1 K non-uniformity with a heat flow of up to 0.5 MW/m².

14. The method of claim 12, wherein the microchannel heat sink assembly is a four-compartment microchannel heat sink assembly with symmetrical areas.

15. The method of claim 12, wherein the metal mesh is a structured micro-size metal mesh.

16. The method of claim 12, wherein the thermal interface materials component is an ultrathin carbon-based thermal interface material.

17. The method of claim 14, wherein each compartment has a separate inlet and outlet.

18. The method of claim 12, wherein the width of the channels varies from 3.5 mm near the inlet and is reduced to 1 mm near the outlet.

19. The method of claim 12, wherein the microchannel heat sink assembly is configured with at microelectronic chip is a 25 mm² high-performance chip.

* * * * *